United States Patent [19]

Nishijima

[11] Patent Number: 5,559,836
[45] Date of Patent: Sep. 24, 1996

[54] KEYED PULSE SENSOR CIRCUIT

[75] Inventor: Kazunori Nishijima, Tokyo, Japan

[73] Assignee: NEC Corporation, Japan

[21] Appl. No.: 372,859

[22] Filed: Jan. 13, 1995

Related U.S. Application Data

[63] Continuation of Ser. No. 90,403, Jul. 12, 1993, abandoned.

[30] Foreign Application Priority Data

Jul. 15, 1992 [JP] Japan .................... 4-188034

[51] Int. Cl.⁶ .................... H04L 27/06; H03K 5/08
[52] U.S. Cl. .................... 375/318; 375/344; 327/100
[58] Field of Search ................ 375/257, 287, 375/317–319, 237–239, 344; 327/100, 127

[56] References Cited

U.S. PATENT DOCUMENTS

| | | | |
|---|---|---|---|
| 3,671,935 | 6/1972 | Lipp et al. | 371/55 |
| 4,029,904 | 6/1977 | Papeschi | 375/318 |
| 4,654,862 | 3/1987 | Camborde et al. | 375/317 X |
| 4,695,742 | 9/1987 | Randall | 327/101 |
| 4,942,315 | 7/1990 | Tarng | 327/72 |
| 5,045,800 | 9/1991 | Kung | 327/176 |
| 5,140,591 | 8/1992 | Palara et al. | 327/109 |

FOREIGN PATENT DOCUMENTS

| | | |
|---|---|---|
| 0356085 | 11/1989 | European Pat. Off. . |
| 2189956 | 4/1987 | United Kingdom . |

*Primary Examiner*—Young T. Tse
*Attorney, Agent, or Firm*—Laff, Whitesel, Conte & Saret, Ltd.

[57] ABSTRACT

A pulse sensor for sensing keyed pulses for a keyed AFC which is used in a hi-vision satellite broadcast receiver, has a differentiating circuit that differentiates pulse signals supplied thereto so as to be amplified by a dc amplifier. The amplified signal is transformed by a window comparator such that a resultant signal having a fixed voltage level is output as a pulse sense signal. The sensor circuit is simplified and can be easily manufactured in an integrated circuit configuration.

7 Claims, 7 Drawing Sheets

KEYED PULSE INPUT

OUTPUT FROM MULTIVIBRATOR

KEYED PULSE 101

DIFFERENTIATION OUTPUT 201

DC AMPLIFIER OUTPUT 301

COMPARATOR OUTPUT 401

KEYED PULSE 102

DIFFERENTIATION OUTPUT 202

DC AMPLIFIER OUTPUT 302

COMPARATOR OUTPUT 402

KEYED PULSE SENSOR CIRCUIT

This application is a continuation of application Ser. No. 08/090,403, filed Jul. 12, 1993, now abandoned.

BACKGROUND OF THE INVENTION

The present invention relates to a pulse sensor circuit, and in particular, to a keyed automatic frequency control (AFC) pulse sensor circuit for use in a hi-vision satellite broadcast receiver.

DESCRIPTION OF THE PRIOR ART

In order for a satellite broadcast receiver to guarantee a high-quality signal reception for a long period of time, it is an important factor that each of first and second local oscillators produces a stable frequency. Namely, a frequency change in a second intermediate frequency is required to be in a range of ±500 kHz for a variation of ±2 MHz in a frequency of input signal. When the frequency variation is beyond the range, the operating frequency shifts from a central frequency of such a related circuit as a second intermediate frequency band-pass filter (BPF), a tuning circuit, or an FM demodulator. As a result, the distortion is increased in a differential gain and a differential phase; moreover, the signal-to-noise (SN) ratio may possibly be lowered, which leads to deterioration of the reception quality. In consequence, it is necessary to add an automatic frequency controller (AFC) to the second local oscillator to absorb the variation in the local oscillation frequency, thereby stabilizing the second intermediate frequency.

The AFC circuit is used to control the local oscillation frequency and to automatically correct the variation in the input frequency, thereby keeping an appropriate intermediate frequency. Specifically, as can be seen from an example of FIG. 1, the circuit includes a first intermediate frequency (IF) amplifier 31, a frequency converter 32, a band-pass filter 33, an automatic gain controller (AGC) 34, a limiter circuit 35, an FM demodulator 36, an integration circuit 38, and a local oscillator 39. In the block diagram, since a change in a direct-current (dc) voltage of an output from the demodulator circuit 36 is in proportion to a variation in the intermediate frequency, the dc voltage is employed as a control voltage 37. This voltage 37 is fed to the integrating circuit 38 such that a modulated frequency component is removed therefrom so as to supply a resultant signal to a varactor diode of the oscillator circuit 39. As a result, there is formed a control loop to achieve an automatic frequency control.

The AFC operation according to procedures of the National Television System Commitee (NTSC) has been briefly described. In the hi-vision system, however, the AFC operation is slightly different therefrom. That is, in the circuit constitution of FIG. 2, a keyed pulse 41 is received from a decoder of a multiple sub-Nyquist sampling encoding (MUSE) system. The pulse 41 is delivered to a sample holding circuit 43 such that an FM demodulation voltage from an FM demodulator 36 is held as a sample by the circuit 43 so as to obtain a mean value of the FM demodulation voltage, thereby applying the attained FM demodulation voltage to a varactor diode of a local oscillator 39.

To implement the different automatic frequency control operation in a receiver, there is necessitated a system as shown in FIG. 2. Namely, it is required to dispose a switch (SW) 44 to select the FM demodulation voltage or the voltage obtained by processing the FM demodulation voltage through the sample holding circuit 43 according to the keyed pulse 41 and a keyed pulse sensor 42 to control the switch 44 depending on the keyed pulse 41.

The keyed pulse sensing circuit 42 of the prior art includes, for example, a capacitor 18 connected to an input terminal 12, a pulse amplifier 10 including resistors 14 and 15 and an inverter 16, and a one-shot multi-vibrator 11 as shown in FIG. 3. In the sensor 42, the pulse amplifier 10 is connected to a preceding stage of the multivibrator 11. This is because the keyed pulse has a low output voltage 0.5 Vpp and hence an output of at least 5 Vpp is required to drive the multivibrator 11 in a subsequent stage.

The output from the multivibrator 11 is kept remained at 5 V when the keyed pulse is successively supplied thereto. However, in a case where only one keyed pulse is inputted thereto, a time constant of the multivibrator 11 is adjusted so as to produce a pulse having a time width exceeding a period of the keyed pulse. FIGS. 4A and 4B specifically show relationships between the input keyed pulses and the output from the one-shot multivibrator.

However, in the conventional pulse sensor circuit described above, since digital processing is conducted by the pulse amplifier and the one-shot multivibrator, a complementary metal-oxide semiconductor integrated circuit (CMOS-IC) is necessary as an external element. This leads to a problem of increase in the number of constituent elements. Furthermore, in a case where the pertinent circuit block is to be incorporated in an FM demodulator circuit, the circuit configuration becomes to be very complex. Consequently, it is quite difficult to manufacture the circuit in an integrated circuit structure.

SUMMARY OF THE INVENTION

It is therefore an object of the present invention to provide a pulse sensor circuit in which the circuit for sensing keyed pulses for a keyed automatic frequency control is simplified and is thereby easily fabricated in an integrated circuit form.

In accordance with the present invention, there is provided a pulse sensor circuit including a differentiation circuit for receiving a pulse signal and for producing a differentiated signal therefrom, a dc amplifier for amplifying the differentiated signal, and a window comparator for receiving a signal created from the dc amplifier and setting a central voltage of a blind sector to a dc voltage of the dc amplifier in a signal-free state where the amplifier is not outputting any amplifier signal to the comparator.

In the pulse detecting circuit according to the present invention, a keyed pulse is supplied to a differentiation circuit having a time constant sufficiently larger than a pulse width of the keyed pulse so as to generate a sawtooth wave signal. The obtained signal is then fed to the window comparator for a comparison thereof. The keyed pulse sensor can be formed only of analog circuits such as a differentiation circuit and a window comparator.

BRIEF DESCRIPTION OF THE DRAWINGS

The objects and features of the present invention will become more apparent from the consideration of the following detailed description taken in conjunction with the accompanying drawings wherein:

FIG. 8 is a block diagram showing an alternative embodiment of a pulse sensor in accordance with the present invention.

DESCRIPTION OF THE PREFERRED EMBODIMENT

Figure 1:
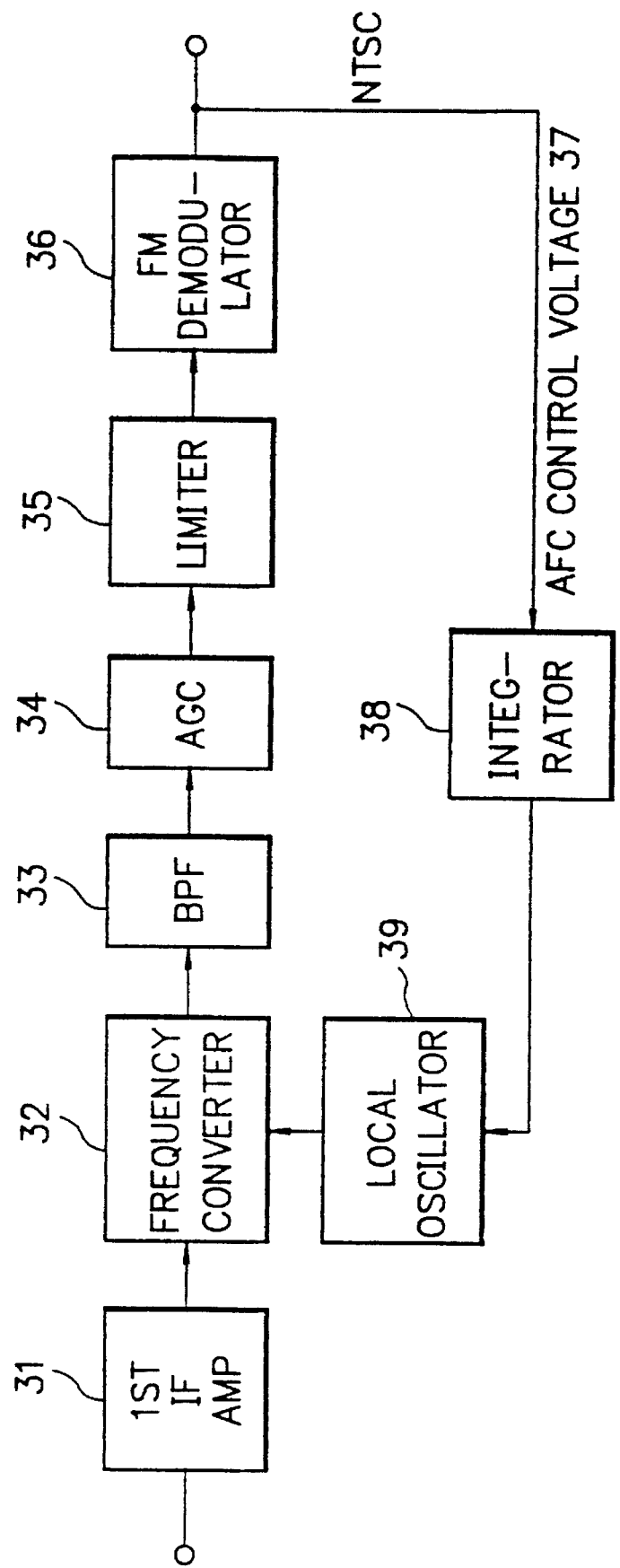
FIG. 1 is a schematic block diagram showing an outline of a satellite broadcast receiver.
Figure 2:
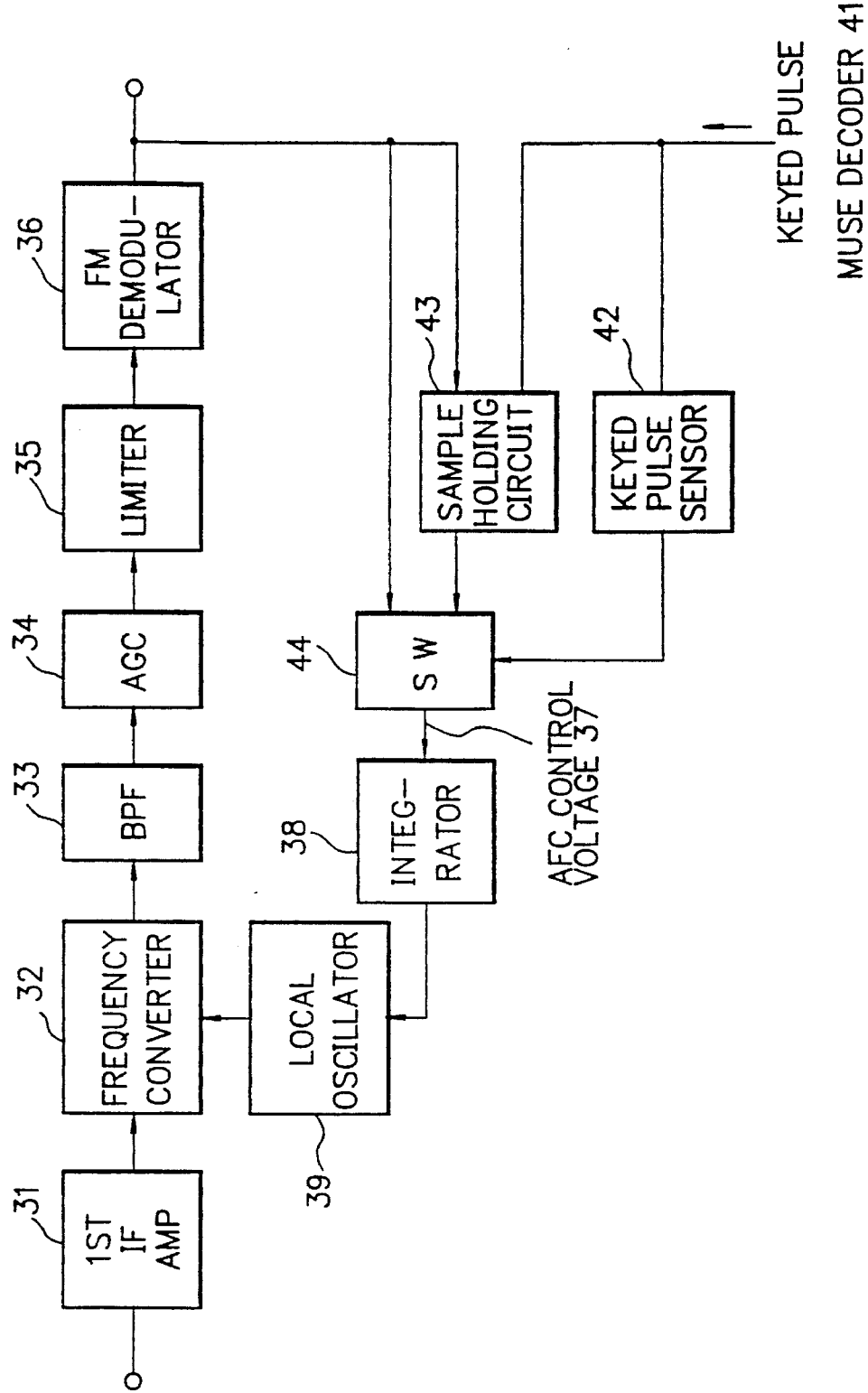
FIG. 2 is a block diagram illustratively showing a hi-vision satellite broadcast receiver.
Figure 3:
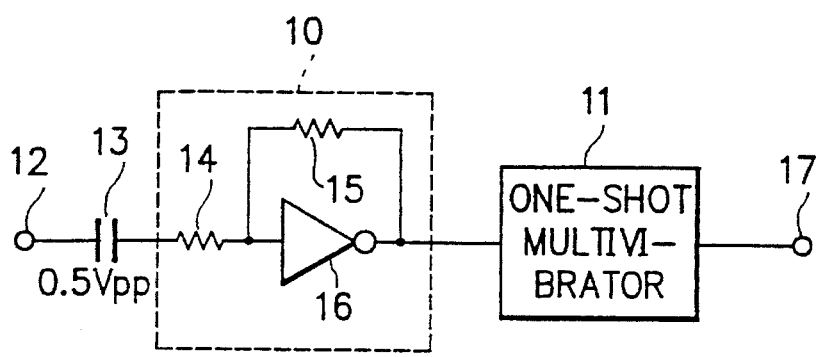
Figure 4A:
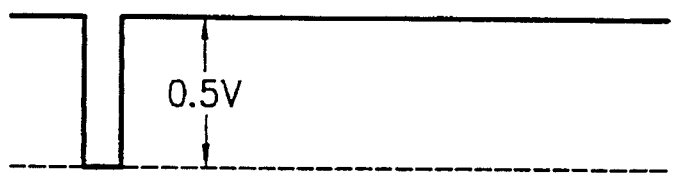
FIGS. 4A and 4B are graphs showing input and output signal waveforms in the pulse sensor of FIG. 3.
Figure 4B:
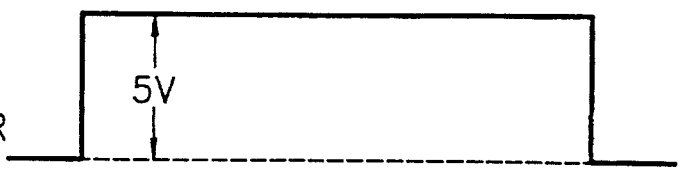
Figure 5:
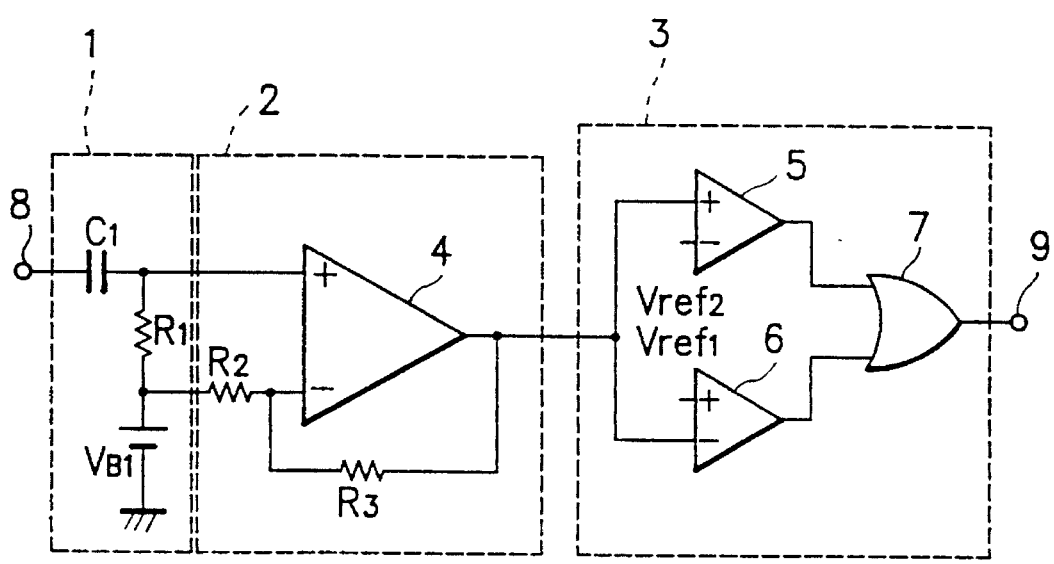
FIG. 5 is a block diagram showing an embodiment of a pulse sensor circuit in accordance with the present invention.

Referring now to the accompanying drawings, description will be given of an embodiment of a pulse sensor circuit in accordance with the present invention. FIG. 5 shows the circuit constitution of the pulse sensor, which includes a differentiation circuit 1, a dc amplifier 2, and a window comparator 3. The circuit 1 includes a capacitor $C_1$, a resistor $R_1$, and a bias voltage source $V_{B1}$. The dc amplifier 2 includes an operation amplifier 4 and resistors $R_2$ and $R_3$. The circuit 8 includes comparators 5 and 6, an OR gate 7, and voltage sources $V_{ref1}$ and $V_{ref2}$.

Figure 6A:
FIGS. 6A to 6D are graphs showing signal waveforms in various sections of the pulse sensor of FIG. 5.
Figure 6B:
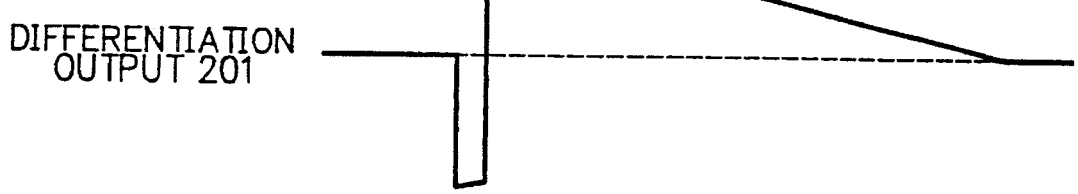
Figure 6C:
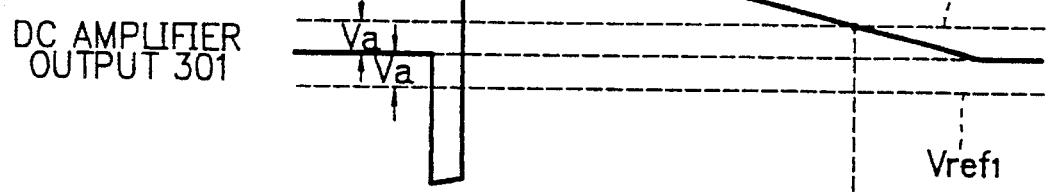
Figure 6D:

In the pulse sensor, when a keyed pulse 101 shown in FIG. 6A is supplied to an input terminal 8, the circuit 1 produces a differentiation output 201 of FIG. 6B. In the system, a time constant developed by the resistor $R_1$ and the capacitor $C_1$ is sufficiently greater than a time width of the pulse 101. Amplifying the output signal 201 by the amplifier 2, there is created an output 301 shown in FIG. 6C. The obtained signal 301 is delivered as an input to the comparator 3. In this situation, when the reference voltages $V_{ref1}$ and $V_{ref2}$ respectively of the comparators 5 and 6 are set as shown in FIG. 6C, a width of the blind sector of the comparator 3 is represented by a range of 2Va centered on the dc voltage of the output signal 301 from the amplifier in the signal-free state where the amplifier 2 is not producing the amplified output. The comparator 3 resultantly produces an output 401 of FIG. 6D.

Figure 7A:
FIGS. 7A to 7D are graphs showing signal waveforms in the respective sections of the sensor of FIG. 5.
Figure 7B:
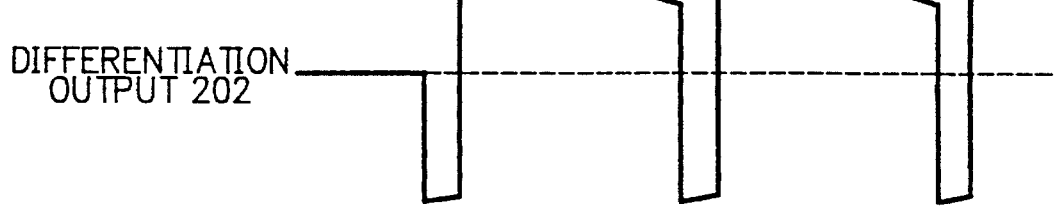
Figure 7C:
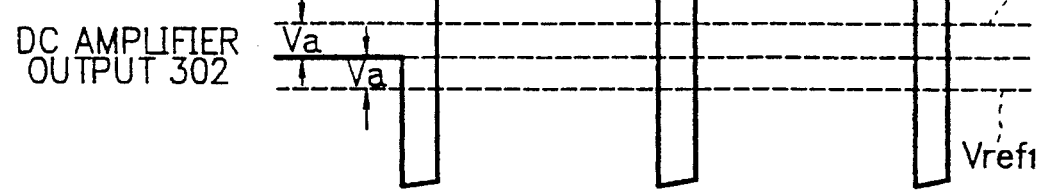
Figure 7D:

Subsequently, assuming that keyed pulses 102 (having a fixed period) of FIG. 7A are inputted to the terminal 8, the differentiating circuit 1 generates an output 202 of FIG. 7B. Moreover, the amplifier 2 produces an output 302 as shown in FIG. 7C. Finally, the window comparator 3 creates an output signal 402 of FIG. 7D, which is kept remained at a high (H) level. In consequence, while the keyed pulses 102 are being continually supplied to the input terminal 8, the comparator 3 continuously produces an H-level output signal even in an interval of time in which the keyed pulse is absent. Namely, it is assumed that the keyed pulse is sensed even in such an interval. The obtained signal is fed as a pulse sense signal from an output terminal 9 to an external device.

Figure 8:
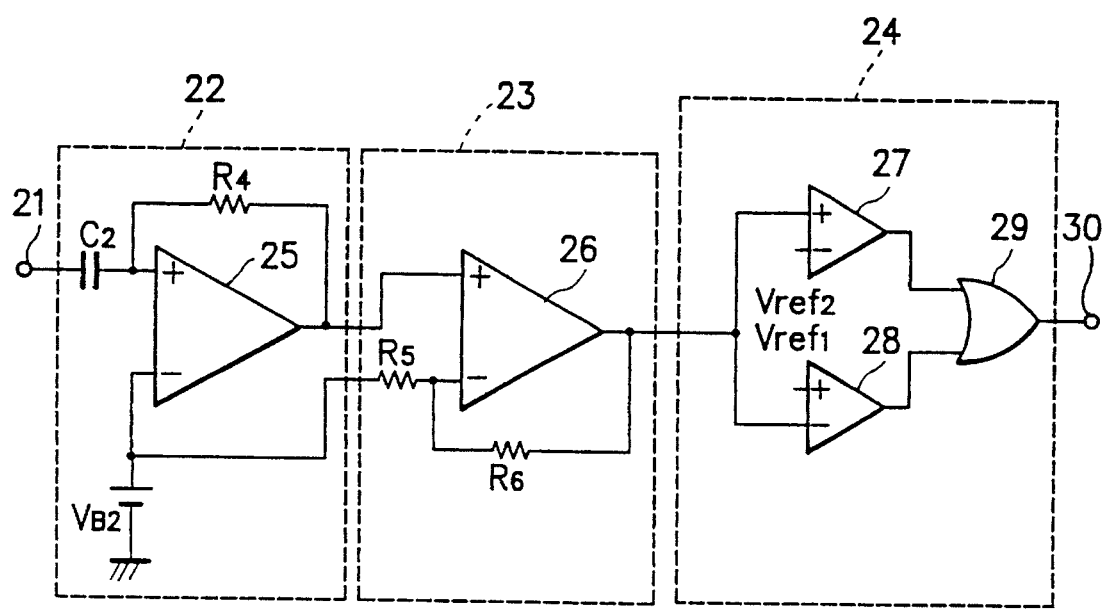
FIG. 8 is a block diagram schematically showing an example of a conventional pulse sensor circuit.

FIG. 8 shows an alternative embodiment of the pulse sensor in accordance with the present invention. The sensor circuit includes an integration circuit 22, a dc amplifier 23, and a window comparator 24. The circuit 22 is different from that of FIG. 5 including the capacitor $C_1$ and the resistor $R_1$. Namely, this sensor includes a capacitor $C_2$, a resistor $R_4$, an operation amplifier 25, and the bias voltage source $V_{B2}$. The amplifier 23 includes an operation amplifier 26 and resistors $R_5$ and $R_6$. The comparator circuit 24 includes comparators 27 and 28, and OR gate 29, and voltage sources $V_{ref1}$ and $V_{ref2}$. Operation of the system is identical to that shown in FIG. 5 and hence description thereof will be avoided.

As above, the pulse sensor circuit in accordance with the present invention simply includes analog circuits to sense keyed pulses. Consequently, the number of necessary elements thereof can be decreased. Moreover, when the pulse sensor of the present invention is to be incorporated in, for example, an FM demodulator circuit, there can be easily fabricated an integrated circuit thereof.

While the present invention has been described with reference to the particular illustrative embodiment, it is not to be restricted by those embodiment but only by the appended claims. It is to be appreciated that those skilled in the art can change or modify the embodiment without departing from the scope and spirit of the present invention.

What is claimed is:

1. A keyed pulse sensor circuit comprising:

differentiating circuit means for receiving an input pulse signal and producing a differentiation signal therefrom;

dc amplifier means for amplifying the differentiation signal; and window comparator means for receiving as an input thereto an output signal from said dc amplifier means and setting a central voltage of a blind sector thereof to a dc voltage from said dc amplifier means in a signal-free state where said dc amplifier means is not producing any amplified output.

2. The keyed pulse sensor circuit as claimed in claim 1, wherein:

said dc amplifier means comprises an operational amplifier circuit.

3. The keyed pulse sensor circuit as claimed in claim 1, wherein:

said window comparator means comprises a pair of comparators each connected to said dc amplifier means and an OR gate connected to the comparators.

4. An automatic frequency controller circuit comprising:

an FM demodulator circuit;

a sample holding circuit for holding an FM demodulation voltage from said FM demodulator circuit as a sample by a keyed pulse from a decoder of a multiple sub-Nyquist sampling encoding (MUSE) system;

a switch for selecting the FM demodulation voltage from said FM demodulator circuit or a voltage obtained by processing the FM demodulation voltage through said sample holding circuit; and a keyed pulse sensing circuit for controlling said switch depending on the keyed pulse;

said keyed pulse sensing circuit comprising:

differentiating circuit means for receiving the keyed pulse and producing a differentiation signal therefrom;

dc amplifier means for amplifying the differentiation signal; and window comparator means for receiving as an input thereto an output signal from said dc amplifier means and setting a central voltage of a blind sector thereof to a dc voltage from said dc amplifier means in a signal-free state where said dc amplifier means is not producing any amplified output.

5. The automatic frequency controller circuit as claimed in claim 4, wherein:

said dc amplifier means comprises an operational amplifier circuit.

6. A keyed pulse sensor circuit for converting a keyed pulse signal (101) having a relatively short duration defined by a leading edge and trailing edge into a continuous pulse (401) having a relatively long duration, the keyed pulse sensor circuit comprising:

- differentiating circuit means (1) for differentiating the keyed pulse signal (101) to obtain a differentiated signal (201) of a first differentiation waveform representative of a differentiation at the leading edge of the keyed pulse signal and a second differentiation waveform representative of a differentiation at the trailing edge of the keyed pulse signal;

- direct-current amplifier means (2) for amplifying the differentiated signal (201) to obtain an amplified signal (301) which consists of a third differentiation waveform substantially equivalent in form to and increased in amplitude from the first differentiation waveform so that the third differentiation waveform has at a trailing edge a voltage which is larger in amplitude than a first preset voltage (Va) and a fourth differentiation waveform substantially equivalent in form to and increased in amplitude from the second differentiation waveform so that the fourth differentiation waveform has at a leading edge a voltage which is larger in amplitude than a second preset voltage (Va); and

- window comparator means (3) for comparing the amplified signal (301) with a blind sector defined by a first reference voltage ($Vref_1$) equivalent in amplitude to the first preset voltage (Va) and a second reference voltage ($Vref_2$) equivalent in amplitude to the second preset voltage (Va) so that a comparison (6) between the third differentiation waveform and the first reference voltage ($Vref_1$) provides a first comparison result and a comparison (5) between the fourth differentiation waveform and the second reference voltage ($Vref_2$) provides a second comparison result, for obtaining a logical sum (7) between the first and second comparison results to output the continuous pulse.

7. The keyed pulse sensor circuit as claimed in claim 6, wherein the window comparator means (3) comprises:

- a first comparator (6) for comparing the amplified signal (301) with the first reference voltage ($Vref_1$) to perform the comparison between the third differentiation waveform and the first reference voltage ($Vref_1$);

- a second comparator (5) for comparing the amplified signal (301) with the second reference voltage ($Vref_2$) to perform the comparison between the fourth differentiation waveform and the second reference voltage ($Vref_2$); and

- an OR gate (7) for producing the logical sum of the first and second comparison results.

* * * * *